United States Patent
Reinhold et al.

(10) Patent No.: US 8,497,864 B2
(45) Date of Patent: Jul. 30, 2013

(54) METHOD AND DEVICE FOR DISPLAYING LINES BETWEEN SAMPLED MEASUREMENT VALUES

(75) Inventors: Michael Reinhold, Munich (DE); Markus Freidhof, Kirchseeon (DE)

(73) Assignee: Rohde & Schwartz GmbH & Co. KG, München (DE)

( * ) Notice: Subject to any disclaimer, the term of this patent is extended or adjusted under 35 U.S.C. 154(b) by 735 days.

(21) Appl. No.: 12/672,492

(22) PCT Filed: Jun. 13, 2008

(86) PCT No.: PCT/EP2008/004790
§ 371 (c)(1),
(2), (4) Date: Mar. 4, 2010

(87) PCT Pub. No.: WO2009/033513
PCT Pub. Date: Mar. 19, 2009

(65) Prior Publication Data
US 2011/0267349 A1    Nov. 3, 2011

(30) Foreign Application Priority Data
Sep. 6, 2007   (DE) .......................... 10 2007 042 323

(51) Int. Cl.
*G06T 11/20* (2006.01)
(52) U.S. Cl.
USPC ........................................................ 345/443
(58) Field of Classification Search
USPC .......................................... 340/443; 345/443
See application file for complete search history.

(56) References Cited

U.S. PATENT DOCUMENTS

| | | | |
|---|---|---|---|
| 4,359,728 A | 11/1982 | Mahony | 345/440.1 |
| 4,755,960 A * | 7/1988 | Batson et al. | 708/203 |
| 5,550,963 A * | 8/1996 | Siegel et al. | 345/440 |
| 5,668,469 A * | 9/1997 | Natori et al. | 324/121 R |
| 6,104,374 A * | 8/2000 | Sullivan et al. | 345/694 |
| 2003/0107574 A1 | 6/2003 | Ritter | 345/440 |

FOREIGN PATENT DOCUMENTS

| | | |
|---|---|---|
| EP | 0209226 A2 | 1/1987 |
| EP | 0356114 | 2/1990 |
| EP | 0209226 B1 | 6/1993 |
| EP | 0631143 | 12/1994 |
| EP | 0919818 A1 | 6/1999 |
| EP | 0937987 | 8/1999 |
| EP | 0947842 | 10/1999 |
| EP | 0919818 B1 | 2/2003 |
| GB | 2295948 | 6/1996 |

* cited by examiner

*Primary Examiner* — M Good Johnson
(74) *Attorney, Agent, or Firm* — Marshall, Gerstein & Borun LLP

(57) ABSTRACT

Measurement points for display on a two-dimensional pixel-based display device are formed by scanned and digitized measurement values. To this end, the resolution of each measurement point according to time and/or value is higher than the resolution of the two-dimensional pixel-based display device. The measurement points are connected into a continuous measurement point curve if they are not located on directly adjoining pixels. In order to determine the pixels to be depicted of the continuous measurement point curve between two measurement points not located on directly adjoining pixels, the positions of the adjoining measurement points within the associated pixels are taken into consideration.

8 Claims, 7 Drawing Sheets

METHOD AND DEVICE FOR DISPLAYING LINES BETWEEN SAMPLED MEASUREMENT VALUES

BACKGROUND OF THE INVENTION

1. Field of the Invention

The invention relates to a method and a device for displaying digital measurement values on pixel-based display devices, in particular, display devices in measuring devices.

2. Related Technology

For the display of digital measurement values on pixel-based displays, the measurement values are conventionally imaged as precisely as possible onto individual pixels. However, if the measurement values are disposed far apart, an image of poor legibility, which only consists of individual points, is obtained. For this reason, an interpolation between the measurement values is conventionally implemented. This produces a more readily legible image, but is associated with high calculation costs. However, if the sampling times of the digital signal are not synchronized with the image change of the display, an unstable image is also obtained with this method, because different measurement curves result from the different interpolation points of the interpolation.

Accordingly, a method and a device for the presentation of waveforms are disclosed in EP 0 919 818 B1. The method uses an interpolation of displayed points between measurement values. On one hand, this requires a high calculation cost. On the other hand, a stable image is not always produced, since the position of the interpolation points of the interpolation varies because of lack of synchronicity of the sampling times with the structuring of the image.

SUMMARY OF THE INVENTION

The invention provides a method and a device, which present digital measurement values on a display with a stable image, good legibility and low calculation costs.

Accordingly, the invention provides a method for displaying measurement values on a two-dimensional, pixel-based display device of a measuring device, wherein the measurement values are sampled and digitized, the sampled and digitized measurement values form measurement points within a two-dimensional coordinate system, the resolution of each measurement point according to time and/or value is higher than the resolution of the two-dimensional, pixel-based display device, the measurement points on the two-dimensional, pixel-based display device are connected to form a continuous measurement-point curve, if the measurement points are not disposed on directly adjacent pixels, wherein, to determine the pixels of the continuous measurement-point curve between two measurement points to be displayed, the position of the adjacent measurement points within the associated pixels is taken into consideration, if the measurement points are not disposed on directly adjacent pixels.

Further, the invention provides a device for displaying measurement values on a two-dimensional, pixel-based display device, with a scaling device, a pixel-assignment device, and a pixel-connecting device, wherein the scaling device scales the sampled and digitized measurement values of the two-dimensional, pixel-based display device corresponding to measurement points, the resolution according to time and/or value of each measurement point is higher than the resolution of the two-dimensional, pixel-based display device, the pixel-assignment device assigns the measurement points to pixels of the two-dimensional, pixel-based display device, the pixel-connecting device connects the measurement points to form a continuous measurement-point curve, if the measurement points are not disposed on directly adjacent pixels, and the pixel-connecting device communicates the continuous measurement-point curve to the display device, wherein, to determine the pixels of the continuous measurement-point curve between two measurement points to be displayed, the pixel-connecting device takes into consideration the position of the adjacent measurement points within the associated pixel, if the measurement points are not disposed on directly adjacent pixels.

For the display of measurement values on a two-dimensional pixel-based display device, measurement points in a two-dimensional coordinate system are formed from sampled and digitized measurement values. In this context, the resolution of each measurement point according to time and/or value is higher than the resolution of the two-dimensional, pixel-based display. The measurement points are connected to form a continuous measurement-point curve, if they are not disposed on directly adjacent pixels. To determine the pixels of the continuous measurement-point curve between two measurement points to be displayed, which are not disposed on directly adjacent pixels, the position of the adjacent measurement points within the associated pixels is taken into consideration. The continuous measurement-point curve displayed becomes clearer as a result and, over the time course of the measurement with a constant signal, is more stable than with conventional display methods.

To determine the pixels of the continuous measurement-point curve between two adjacent measurement points to be displayed, which are horizontally offset by precisely one pixel, one or more transition points of the continuous measurement-point curve are preferably calculated across the boundaries between the pixel rows. The continuous measurement-point curve from the first of the two adjacent measurement points to the first transition point is advantageously displayed in the pixel row of the first measurement point. The continuous measurement-point curve from the first transition point to the last transition point is advantageously displayed in each case in the scanned pixel row. The continuous measurement-point curve from the last transition point to the second of the two adjacent measurement points is advantageously displayed in the pixel row of the second measurement point.

To determine the pixels of the continuous measurement-point curve between two adjacent measurement points to be displayed, which are vertically offset, a transition point of the continuous measurement-point curve is preferably calculated across the boundaries between the pixel columns. The continuous measurement-point curve from the first of the two adjacent measurement points to the first transition point is advantageously displayed in the pixel column of the first measurement point. The continuous measurement-point curve from the first transition point to the last transition point is advantageously displayed in each case in the scanned pixel column. The continuous measurement-point curve from the last transition point to the second of the two adjacent measurement points is advantageously displayed in the pixel column of the second measurement point. Accordingly, it is unambiguously specified how the measurement-point curve is to be displayed. An unambiguous, clear and at the same time stable curve, which largely corresponds to the characteristic of the analog measurement value is obtained.

The transition point or points are preferably calculated from the proportions of the length of a direct connecting line of the two measurement points extending in the pixel columns or respectively the pixel rows. With a curve obtained in this manner, the proximity to the analog measurement values can be further increased.

The two adjacent measurement points to be connected to form a continuous measurement-point curve are advantageously horizontally or vertically offset by precisely one pixel column or respectively pixel row.

As an alternative, all pixels exceeded by a direct connecting line of the two measurement points to be connected are displayed as a part of the continuous measurement-point curve. As a result of this alternative method, a sufficiently stable and clear curve is achieved with a very low calculation cost.

BRIEF DESCRIPTION OF THE DRAWINGS

The invention is described by way of example with reference to the drawings, in which an advantageous exemplary embodiment of the invention is illustrated. The drawings are as follows.

DETAILED DESCRIPTION

Initially, the problem and the signals occurring are explained with reference to FIGS. 1-6. The functioning of an exemplary embodiment of the method according to the invention is visualized with reference to FIGS. 7 and 9. On the basis of FIG. 10, the functioning of the device according to the invention is explained. In some cases, a repetition of the presentation and description of identical elements in similar drawings has not been provided.

The following table provides a summary of the formula characters used below.

| Abbreviation | Description |
|---|---|
| $f_a$ | Sampling rate |
| $N_{Line}(k)$ | Length of the line between the k-th and the k + 1-th point |
| $N_{Line,1}(k)$, $N_{Line,2}(k)$ | Partial lines |
| $N_{S\_PX}$ | Sample number per column |
| $N_{PX}$ | Number of pixel columns on the screen |
| $S_{PX}(k)$ | Image column of the k-th point |
| $T_{Display}$ | Time on the whole screen |
| $T_{PX}$ | Time per pixel column |
| $T_S$ | Time interval between two samples |
| $t_S(k)$ | Time of the k-th sample |
| $T_{Trigger}$ | Triggering time |

Figure 1:
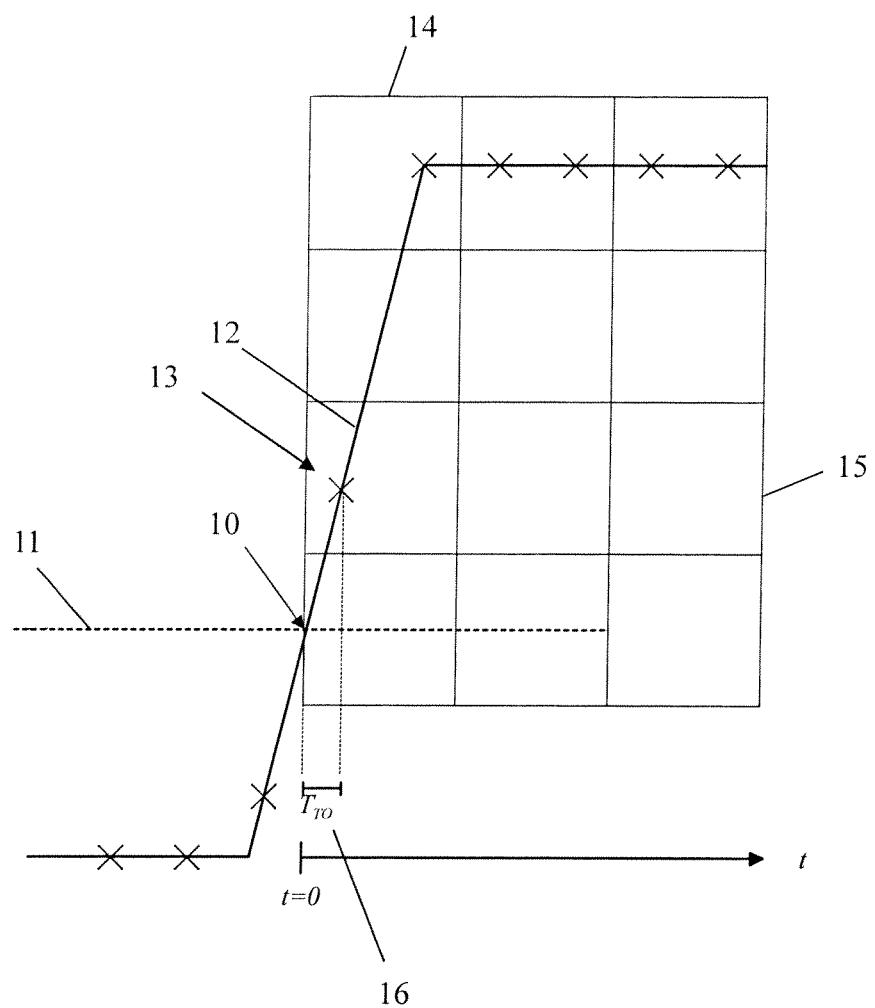
FIG. 1 shows the characteristic of a first exemplary, analog signal and of the associated sampled signal.

In FIG. 1, the characteristic of a first exemplary analog and sampled signal is presented. Let an analog measurement curve be given. This can initially extend horizontally and then ascend and then extend horizontally again. To record this measurement curve 12, let a trigger threshold be defined. Let the timing point $T_{Trigger}$ 10, at which the analog measurement curve 12 exceeds the trigger threshold 11, be selected in the following section as a reference point for the display. The display is realized on a two-dimensional, pixel-based display device, which is subdivided into pixel columns 14 and pixel rows 15. The measurement curve 12 is sampled. The sampled points 17 are disposed on the measurement curve 12 in the display. To simplify the following description, let it be assumed that the measurement curve 12 is only to be displayed on the screen from the triggering time $T_{Trigger}$ 10. For this purpose, a new time axis is defined, wherein the triggering time 10 represents the zero point. In general, the image display could also begin at a random time before or after the triggering time $T_{Trigger}$ 10.

Since triggering and sampling are independent of one another, the first sampled value is not generally disposed exactly at the triggering time, but is offset in time by the trigger offset $T_{TO}$ 16.

Let $f_a$ be the sampling rate, then $$T_S = 1/f_a \tag{1}$$

is the interval between two sampled values 13. The first sampled value 13 is then disposed after the triggering event randomly within the range $$0 \leq T_{TO} < T_S \tag{2}$$

If this first sampled value 13 has the index k=0, then the k-th sampled value 13 is disposed at the time $t_S(k)$ with $$t_S(k) = k \cdot T_S + T_{TO}. \tag{3}$$

If a time $$T_{Display} \tag{4}$$

is displayed on the whole screen, with $N_{PX}$ pixel columns 14, a time $T_{PX}$ per pixel column 14 is calculated as $$T_{PX} = T_{Display}/N_{PX}. \tag{5}$$

A sample $x_S(k)$ is displayed in the m-th pixel column 14, if $$m \cdot T_{PX} \leq k \cdot T_S(k) + T_{TO} < (m+1) \cdot T_{PX} \text{ with } 0 \leq m \leq N_{PX}-1 \tag{6}$$

applies. This equation can also be reformulated as follows:

$$S_{PX}(k) = \text{floor}\left\{\frac{k \cdot T_S(k) + T_{TO}}{T_{PX}}\right\}, \tag{7}$$

wherein $S_{PX}(k)$ indicates the pixel column 14, to which the k-th sample is assigned. The function floor rounds off the argument. This results in an average sample number $N_{S\_PX}$ per column of $$N_{S\_PX} = \frac{T_{Display}}{T_S \cdot N_{PX}}. \tag{8}$$

By way of example: if $$f_a = 1 \text{ GHz}, \tag{9}$$

it follows that $$T_S = 1/f_a = 1n \text{ sec.} \tag{10}$$

If the screen has $N_{PX}$=1000 columns and if a time of $T_{Display}$=20 µs is displayed, the following results:

$$T_{PX} = T_{Display}/N_{PX} = 20 \text{ } \mu\text{sec}/1000 = 2n \text{ sec} \tag{11}$$

and furthermore $$N_{S\_PX} = \frac{20 \text{ } \mu\text{sec}}{1n \sec \cdot 1000} = 2. \tag{12}$$

By analogy, for $$f_a = 0.5 \text{ GHz}, \tag{13},$$

the following applies $$N_{S\_PX} = \frac{20 \text{ } \mu\text{sec}}{2n \sec \cdot 1000} = 1. \tag{14}$$

Figure 2:
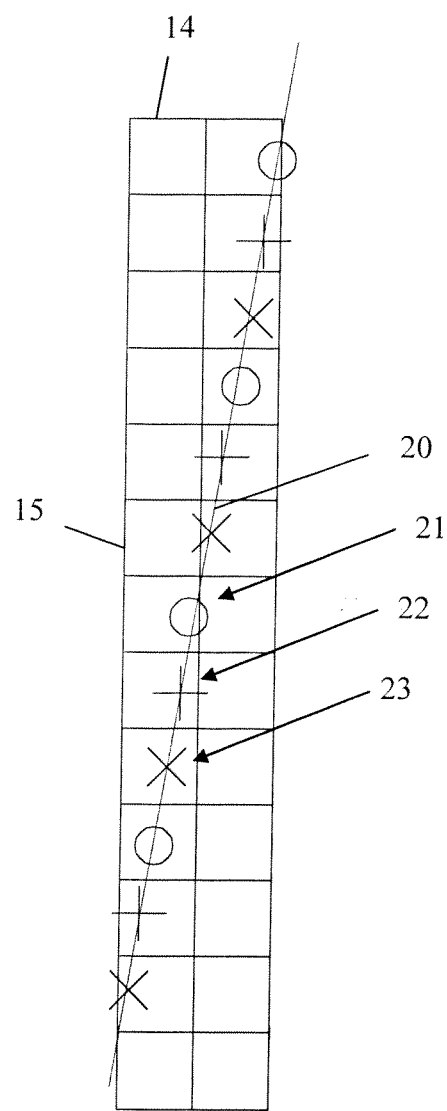
FIG. 2 shows the characteristic of a second exemplary, analog signal and of the associated sampled signal in several sampling runs.

FIG. 2 shows the characteristic of a second exemplary analog and sampled signal 20 in several sampling runs. In this context, the sampled points 21, 22, 23 correspond to three different sampling runs. The distance between sampled points 21, 22, 23 of the same sampling run is greater than the distance between the pixel rows. Accordingly, pixels, in which no sampled points occur, are disposed between the sampled points.

The simplest display mode is the so-called point mode: only the sampled values are presented on the screen as points. If only one measurement curve and a small $N_{S\_PX}$ is available, that is to say, a few points per pixel column, only individual points are shown on screen. In order to show a continuous curve on the screen in point mode, the following conditions are necessary:
- either $N_{S\_PX}$ must be selected to be sufficiently large, which is not always possible,
- or, in the case of a periodic signal, several measurement curves must be superimposed. Since the trigger offset varies in a random manner, a continuous curve is obtained.

In general, the brightness of a pixel on the screen is proportional to the frequency of how often this image point has been "hit".

Figure 3:
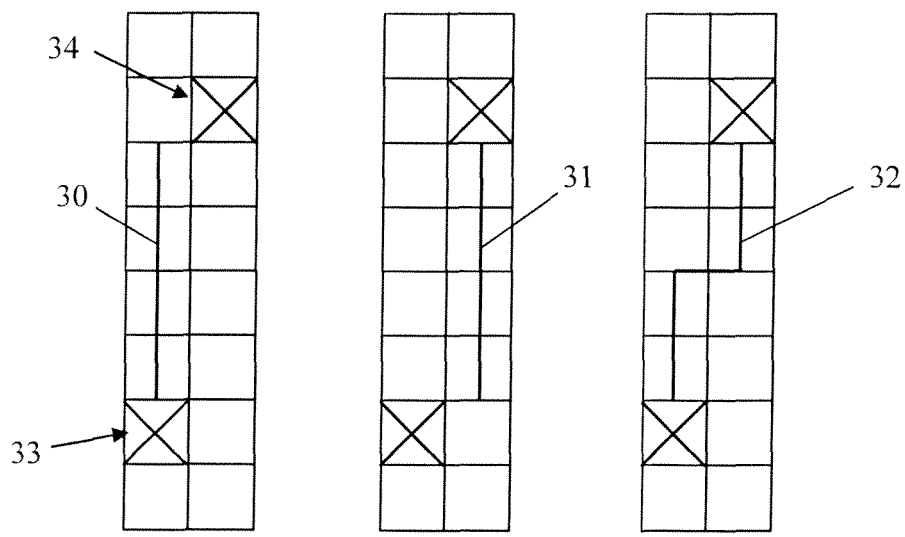
FIG. 3 shows exemplary connection options between measurement points on a two-dimensional display device.

Another mode is the linear mode; in this mode, in each case, two sampled values k and k+1 following one another in time succession are connected by a line in the screen display. In the case of current measuring devices, if these two points are not disposed in the same screen column, three different methods are used for the line display. In FIG. 3, exemplary connecting options for measurement points on a two-dimensional display device are illustrated. A first option is that the line 30 extends completely within the column of the measurement point k 33. A further option is that the line 31 extends completely in the column of the measurement point k+1 34. A final option is that half of the line 32 extends in the column of measurement point k 33 and half in the column of measurement point k+1 34.

The disadvantages of these illustrated methods are that the line does not reflect the actual characteristic of the measured curve. This applies in particular, if the line is drawn completely in the column of measurement point k 33 or of measurement point k+1 34.

Figure 4:
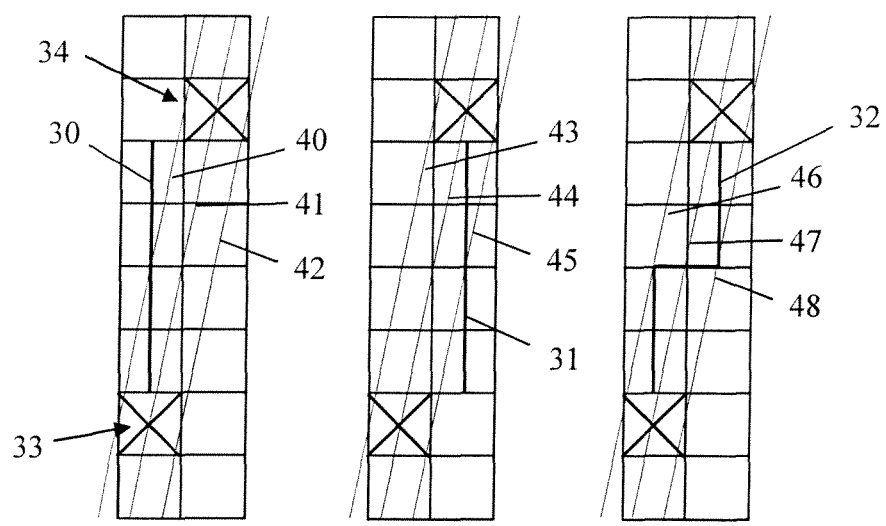
FIG. 4 shows exemplary connection options between measurement points on a two-dimensional display device with superimposed, possible, associated analog signal characteristics.

FIG. 4 shows these exemplary connecting options for measurement points on a two-dimensional display device with superimposed, possible, associated analog signal characteristics. Accordingly, the line 30 is displayed completely in the column of measurement point 33. This provides a good reflection of the possible characteristic 40 of the analog signal. However, as in the case of measurement points 33 and 34, analog signals 41 and 42 are only poorly imaged. Artefacts are formed. Pixels are displayed, which are not passed by the actual analog signal. Similar considerations apply for the linear characteristic 31 and the possible analog signals 44, 45, 46. The linear characteristic 32 achieves better results with the possible analog signals 46, 47, 48, but also fails to provide an optimum for all possible analog signals.

Figure 5:
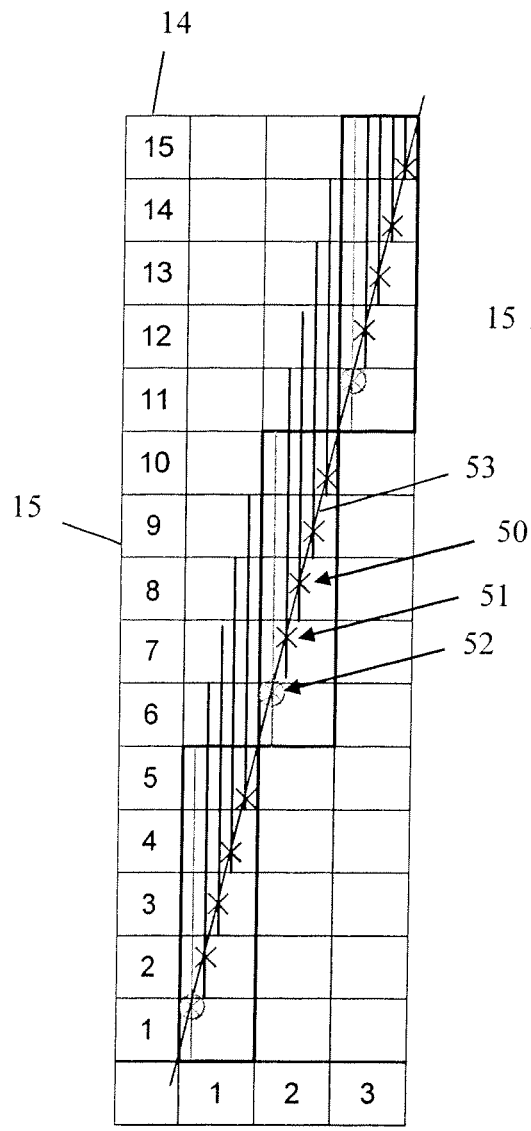
FIG. 5 shows a first exemplary analog signal superimposed over associated measurement points of several sampling runs on a two-dimensional display device.

In FIG. 5, a first exemplary analog signal 53 is superimposed over associated measurement points 50, 51, 52 of several sampling runs on a two-dimensional display device. Let a measurement curve 53 have a gradient of five pixel rows 15 per pixel column 14 and let the sampling be implemented once per pixel column 14, that is to say, $N_{S\_PX}$=1. Let this periodic measurement curve 53 be sampled and recorded five times—each time with a slight time offset. Let these sampled points 50, 51, 52 be marked in the image with X; those of the first sampling are marked with a circle. Here, the connecting line is drawn completely within the column of the measurement point k 33. The connection with the following measurement point of the same sampling run is drawn in for every measurement point.

Figure 6:
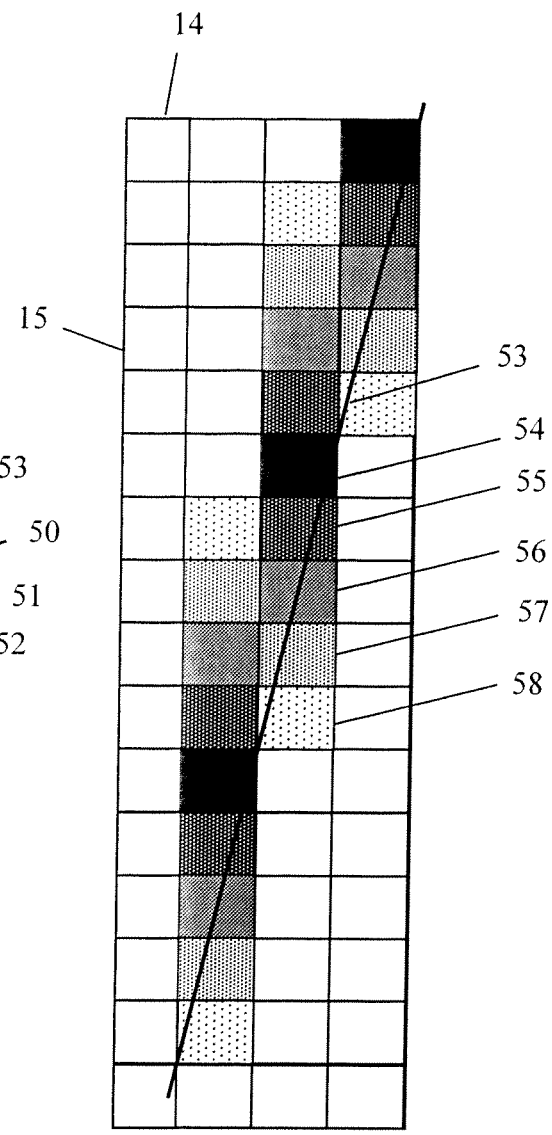
FIG. 6 shows a first exemplary output of a two-dimensional display device resulting from the signal from FIG. 5.

FIG. 6 shows a first exemplary output of a two-dimensional display device resulting from the signal from FIG. 5. The artefacts explained with reference to FIG. 4 are displayed here. If the pixel frequencies are displayed on screen as brightnesses 54, 55, 56, 57, 58, the display is blurred by the drawing of the line on screen.

Figure 7:
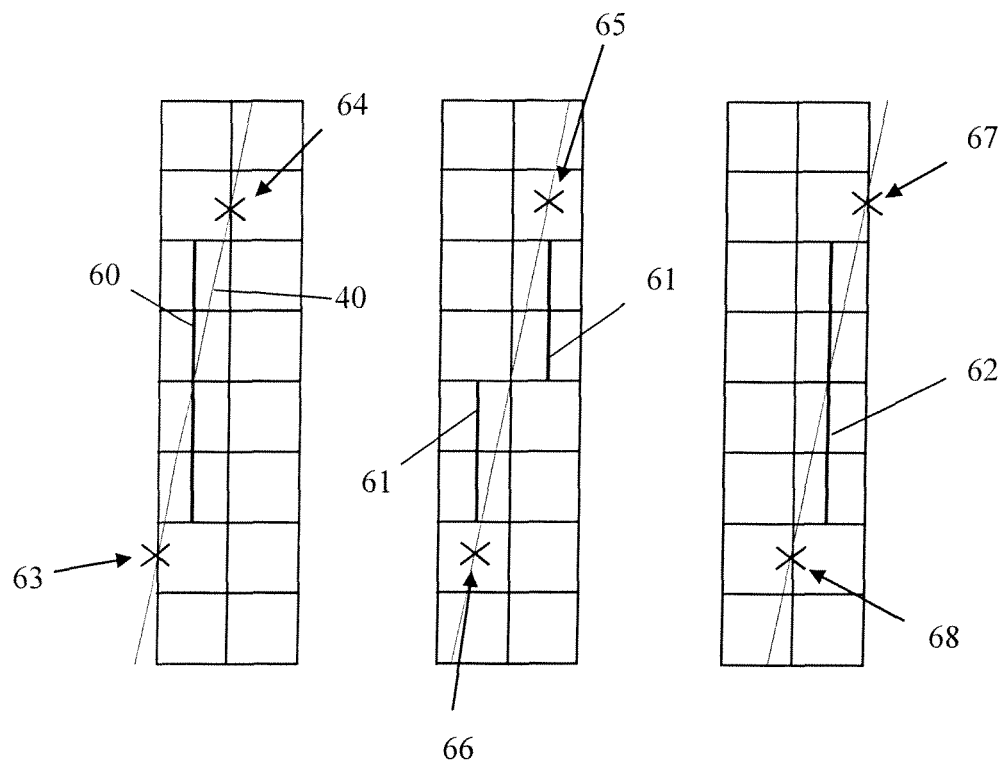
FIG. 7 shows exemplary signals with connections according to the invention of measurement points on a two-dimensional display device.

In FIG. 7, exemplary signals with connections according to the invention between measurement points on a two-dimensional display device are presented. Let $N_{Line}(k)$ be the length of the line between the k-th point 63, 66, 68, which occurs in the pixel column $S_{PX}(k)$=m 14, and the k+1-th point 64, 65, 67, which occurs in the pixel column $S_{PX}(k+1)$=m+1 14. The line 60, 61, 62 is then drawn across two columns. For the subdivision of the line 60, 61, 62 in the two columns, the following relationship applies, wherein $N_{Line,1}(k)$ is the length of the line 60, 61, 62 in the column m and $N_{Line,2}(k)$ is the length of the line 60, 61, 62 in the column m+1:

$$N_{Line,1}(k) = \left(\left\lfloor\frac{k \cdot t_S(k+1)}{T_{PX}}\right\rfloor - \frac{k \cdot t_S(k)}{T_{PX}}\right) \cdot N_{Line}(k) \text{ in } S_{PX}(k) = m \tag{15}$$

$$N_{Line,2}(k) = \left(\frac{k \cdot t_S(k+1)}{T_{PX}} - \left\lfloor\frac{k \cdot t_S(k+1)}{T_{PX}}\right\rfloor\right) \cdot N_{Line}(k) \text{ in } S_{PX}(k+1) = m+1$$

with $N_{Line}(k) = N_{Line,1}(k) + N_{Line,2}(k)$

Equation (15) can also be reformulated: the distance between the k-th and the k+1-th point according to equation (10) is $T_S$. With $$\Delta t_1(k) = S_{PX}(k+1) \cdot T_{PX} - k \cdot t_S(k) = (m+1) \cdot T_{PX} - k \cdot t_S(k)$$
$$\Delta t_2(k) = (k+1) \cdot t_S(k+1) - S_{PX}(k+1) \cdot T_{PX} = (k+1) \cdot t_S(k+1) - (m+1) \cdot T_{PX} \text{ with } T_S = \Delta t_1(k) + \Delta t_2(k) \quad (16),$$

$\Delta t_1(k)$ is the time interval of the k-th point 63, 66, 68 at the start of the next image column m+1, while $\Delta t_2(k)$ indicates how far the k+1-th point 64, 65, 67 is already disposed in the column m+1. If equation (15) is reformulated using equation (16), the following is obtained $$N_{Line,1}(k) = \frac{\Delta t_1(k)}{T_{PX}} \cdot N_{Line}(k) \text{ in } S_{PX}(m) \quad (17)$$

$$N_{Line,2}(k) = \frac{\Delta t_2(k)}{T_{PX}} \cdot N_{Line}(k) \text{ in } S_{PX}(m+1)$$

$$\text{with } N_{Line}(k) = N_{Line,1}(k) + N_{Line,2}(k)$$

Accordingly, it is evident that with the measurement points 63 and 64, which are both disposed at the left-hand edge of their respective pixel column 14, the connecting line 60 extends completely within the pixel column 14 of measurement point 63. In the case of measurement points 65, 66 disposed centrally in the pixels, the connecting line 61 extends in equal portions within the pixel columns 14 of measurement points 65, 66. The measurement points 67, 68 are both disposed at the right-hand edge of their respective pixel column 14. Accordingly, the connecting line 62 extends completely within the pixel column 14 of measurement point 67. The characteristic of the curve for every measurement-point distribution is therefore reflected in an optimum manner within the pixel. Furthermore, the artefacts, as seen in the example from FIG. 6, do not occur.

Figure 8:
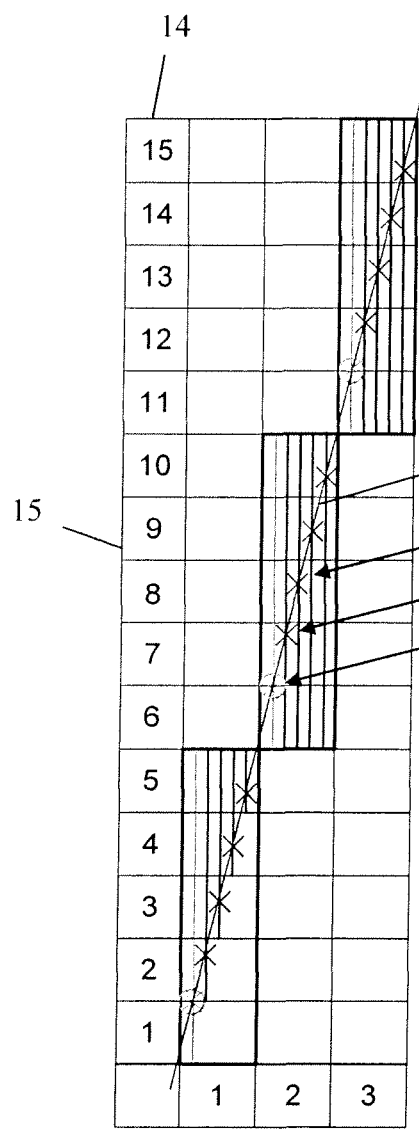
FIG. 8 shows a second exemplary analog signal superimposed over associated measurement points of several sampling runs on a two-dimensional display device.

FIG. 8 shows a second exemplary analog signal 73 superimposed over associated measurement points 70, 71, 72 of several sampling runs on a two-dimensional display device with pixel column 14 and pixel rows 15. By contrast with FIG. 5, the connecting lines between the measurement points 70, 71, 72 here are orientated very much more strongly to the characteristic of the analog signal 73. Only pixels, which are exceeded by the analog signal 73, are touched by the connecting lines.

Figure 9:
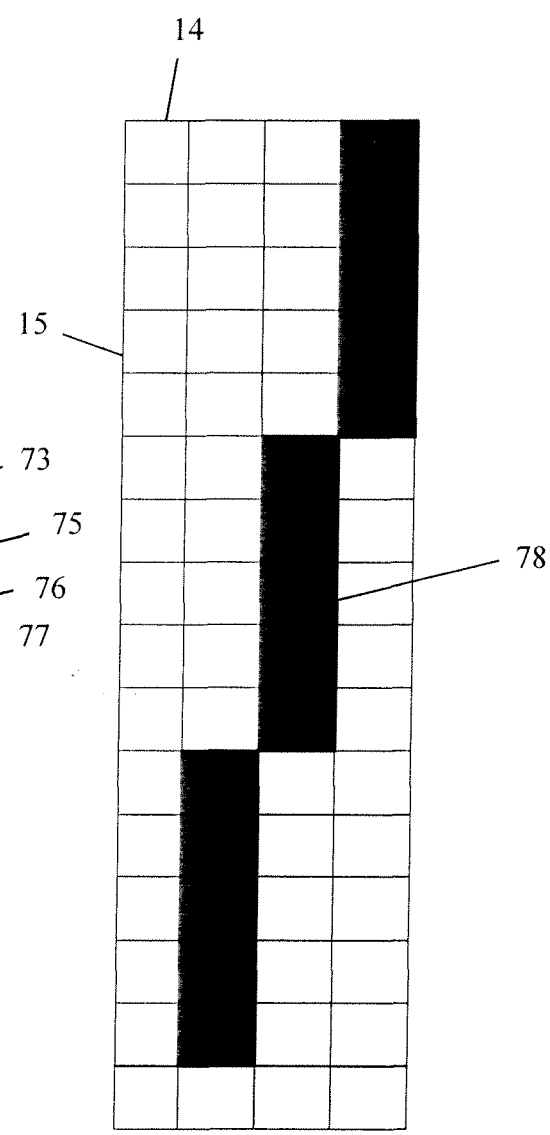
FIG. 9 shows a second exemplary output of a two-dimensional display device here resulting from the signal from FIG. 8.

In FIG. 9, a second exemplary output 74 of a two-dimensional display device, resulting here from the signal 73 from FIG. 8, is illustrated. Since the frequency of the exceeding of each of the pixels, which touch the connecting lines of the measurement points 70, 71, 72, is identical, there is no blurring of the resulting curve. The curve 74 is continuous, clear and adapted in an optimal manner to the analog signal 73.

Accordingly, with the method according to the invention, no artefacts occur. By contrast, with a conventional linear interpolation with $N_{Interpolation}$ interpolation points, artefacts can occur under the following conditions:

if the number of interpolation points $N_{Interpolation}$ is selected too low relative to the current line length $N(k)_{Line}$, for example, 10 interpolation points, while the vertical distance between two image points is 200 lines, then only one point in every 20th line is set. If these 10 interpolation points are connected, artefacts once again occur.

if the number of interpolation points $N_{Interpolation}$ is selected to be large, for example, 100 interpolation points, while the vertical distance between two image points is 10 lines, considerable, superfluous calculation costs are incurred.

moreover, with a fixed number of $N_{Interpolation}$ interpolation points, a further artefact is provided: for example, if $N_{Interpolation}$ 100, then every linear point with $N(k)_{Line}=10$ is set a total of 10 times and appears considerably brighter, than if the line were to have a length of $N(k)_{Line}=100$, wherein each image point is set only once.

Figure 10:
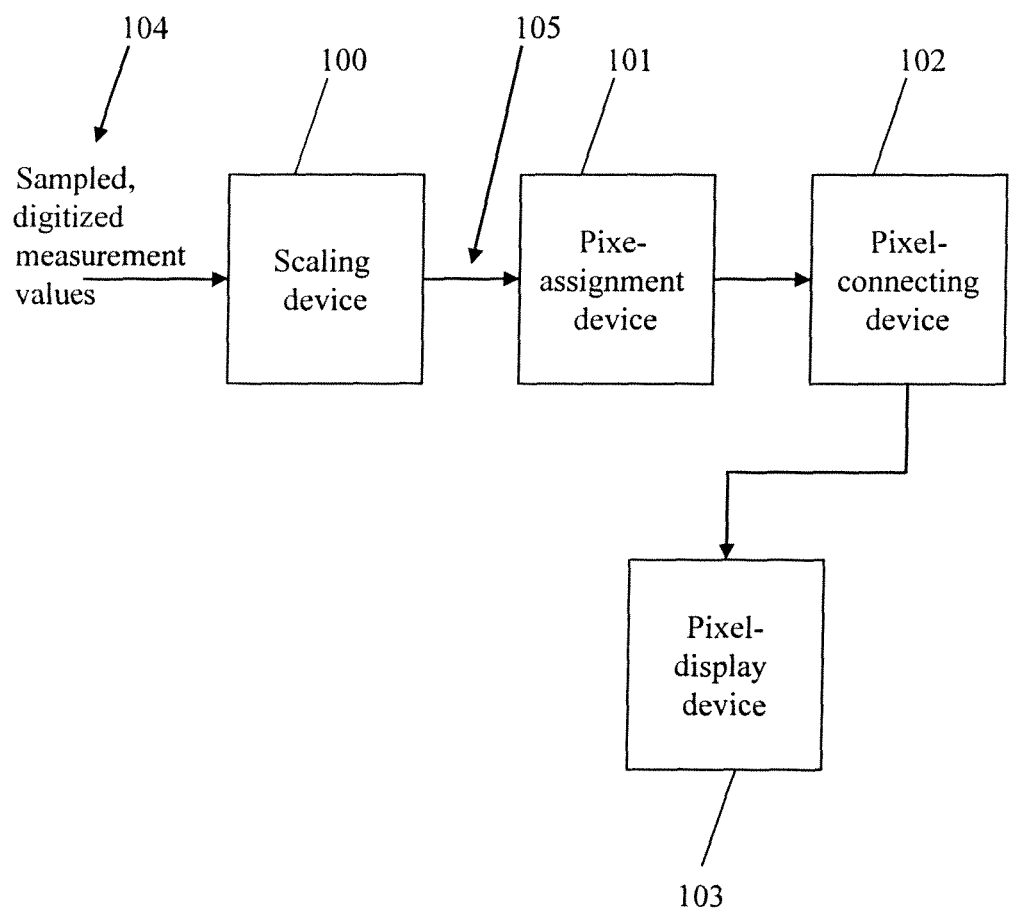
FIG. 10 shows a block-circuit diagram of an exemplary embodiment of the device according to the invention.

In FIG. 10, a block-circuit diagram of an exemplary embodiment of the device according to the invention is illustrated. The sampled, digitized measurement values 104 are transmitted to a scaling device 100. This scales the measurement values 104 in such a manner that they can be displayed on the display device 103. The scaled measurement values 105 are re-routed to the pixel-assignment device 101. This assigns the measurement value pixels to the display device 103. The pixel-connecting device 102 generates the continuous measurement-point curve, if the pixels assigned by the pixel-assignment device 101 are not directly adjacent. The display device 103 displays the continuous measurement-value curve, which was generated by the pixel-connecting device 102.

The invention is not restricted to the exemplary embodiment presented. As already mentioned, both horizontal and also vertical transitions of the measurement-point curve can be processed across the pixel rows or respectively columns. Similarly, the use of the method in three-dimensional, pixel-based displays is conceivable. All the features described above or illustrated in the diagrams can be combined with one another as required within the framework of the invention.

The invention claimed is:

1. A method for displaying measurement values on a two-dimensional, pixel-based display device of a measuring device, comprising:
    sampling and digitizing the measurement values;
    the sampled and digitized measurement values forming measurement points within a two-dimensional coordinate system;
    wherein the resolution of each measurement point according to time and/or value is higher than the resolution of the two-dimensional, pixel-based display device;
    wherein the measurement points on the two-dimensional, pixel-based display device are connected to form a continuous measurement-point curve, if the measurement points are not disposed on directly adjacent pixels;
    to determine the pixels of the continuous measurement-point curve between two measurement points to be displayed, taking into consideration the position of the adjacent measurement points within the associated pixels, if the measurement points are not disposed on directly adjacent pixels;
    to determine the pixels of the continuous measurement-point curve between two adjacent measurement points to be displayed, which are vertically and horizontally offset, calculating one or more transition points of the continuous measurement-point curve across the boundaries between the pixel rows and pixel columns;
    displaying the continuous measurement-point curve from the first of the two adjacent measurement points to the first transition point in the pixel row or respectively pixel column of the first measurement point;
    displaying the continuous measurement-point curve from the first transition point to the last transition point in the respectively exceeded pixel row or respectively pixel column; and displaying the continuous measurement-point curve from the last transition point to the second of the two adjacent measurement points in the pixel row or respectively column of the second measurement point, wherein the calculation of the one or more transition points of the continuous measurement-point curve takes into account the time interval $\Delta t_1(k)$ and/or value interval of the k-th measurement point at the start of the next image column m+1 and the time interval $\Delta t_1(k)$ and/or value interval indicating how far the k+1-th point is disposed in the column m+1.

2. The method according to claim 1, comprising calculating the transition point or respectively the transition points from the proportions of the length of a direct connecting line of the two measurement points extending in the pixel columns or respectively pixel rows.

3. The method according to claim 1, wherein the two adjacent measurement points to be connected to form a continuous measurement-point curve are offset horizontally or vertically by precisely one pixel column or respectively pixel row.

4. The method according to claim 1, comprising displaying all pixels exceeded by a direct connecting line of the two measurement points to be connected as part of the continuous measurement-point curve.

5. A device for displaying measurement values on a two-dimensional, pixel-based display device, with a scaling device, a pixel-assignment device and a pixel-connecting device, wherein the scaling device scales the sampled and digitized measurement values of the two-dimensional, pixel-based display device corresponding to measurement points, the resolution of each measurement point according to time and/or value is higher than the resolution of the two-dimensional, pixel-based display device, the pixel-assignment device assigns the measurement points to pixels of the two-dimensional, pixel-based display device, the pixel-connecting device connects the measurement points to form a continuous measurement-point curve, if the measurement points are not disposed on directly adjacent pixels, the pixel-connecting device communicates the continuous measurement-point curve to the display device, to determine the pixels of the continuous measurement-point curve between two measurement points to be displayed, the pixel-connecting device takes into consideration the position of the adjacent measurement points within the associated pixel, if the measurement points are not disposed on directly adjacent pixels to determine the pixels of the continuous measurement-point curve between two adjacent measurement points to be displayed, which are vertically and horizontally offset, the pixel-connecting device calculates one or more transition points of the continuous measurement-point curve across the boundaries between the pixel rows and pixel columns, the pixel-connecting device specifies the continuous measurement-point curve from the first of the two adjacent measurement points to the first transition point in the pixel row or respectively pixel column of the first measurement point, the pixel-connecting device specifies the continuous measurement-point curve from the first transition point to the last transition point in the respectively exceeded pixel row or respectively pixel column, and the pixel-connecting device specifies the continuous measurement-point curve from the last transition point to the second of the two adjacent measurement points in the pixel row or respectively column of the second measurement point, wherein the calculation of the one or more transition points of the continuous measurement-point curve takes into account the time interval $\Delta t_1(k)$ and/or value interval of the k-th measurement point at the start of the next image column m+1 and the time interval $\Delta t_1(k)$ and/or value interval indicating how far the k+1-th point is disposed in the column m+1.

6. The device according to claim 5, wherein the pixel-connecting device calculates the transition point or respectively the transition points from the proportions of the length of a direct connecting line of the two measurement points extending in the pixel columns or respectively pixel rows.

7. The device according claim 5, wherein the two adjacent measurement points to be connected to form a continuous measurement-point curve are offset horizontally or vertically by precisely one pixel column or respectively pixel row.

8. The device according to claim 5, wherein the pixel-connecting device specifies all pixels exceeded by a direct connecting line of the two measurement points to be connected as part of the continuous measurement-point curve.

\* \* \* \* \*